US007065169B2

(12) United States Patent
Hartwell

(10) Patent No.: US 7,065,169 B2
(45) Date of Patent: Jun. 20, 2006

(54) DETECTION OF ADDED OR MISSING FORWARDING DATA CLOCK SIGNALS

(75) Inventor: David W. Hartwell, Boston, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 782 days.

(21) Appl. No.: 09/944,500

(22) Filed: Aug. 31, 2001

(65) Prior Publication Data

US 2002/0046384 A1    Apr. 18, 2002

Related U.S. Application Data

(60) Provisional application No. 60/229,830, filed on Aug. 31, 2000.

(51) Int. Cl.
*H04L 7/00* (2006.01)
(52) U.S. Cl. .................. 375/354; 327/151; 327/160
(58) Field of Classification Search ................ 375/354, 375/373, 376; 331/10; 713/400; 714/791; 327/151, 160
See application file for complete search history.

(56) References Cited

U.S. PATENT DOCUMENTS

| 4,929,918 | A | * | 5/1990 | Chung et al. ................. 331/10 |
| 5,822,317 | A | * | 10/1998 | Shibata ................. 370/395.62 |
| 6,114,917 | A | * | 9/2000 | Nakajima et al. ............. 331/57 |
| 6,314,150 | B1 | * | 11/2001 | Vowe ......................... 375/374 |

FOREIGN PATENT DOCUMENTS

JP     10-322200     * 12/1998

* cited by examiner

*Primary Examiner*—Temesghen Ghebretinsae
*Assistant Examiner*—Juan Alberto Torres

(57) ABSTRACT

A system is disclosed that detects data forwarding clock errors including both missing and additional clock signals. The system provides for a phase locked loop (PLL) that locks onto a data forwarding source synchronous clock signal wherein the PLL outputs a system clock whose frequency is the average of the data forwarding clock frequency. The data forwarding clock signals and the system clock signals are counted separately and when a discrepancy occurs the receiving system is informed that an error has occurred. The receiving system will handle the error in its routine fashion. The counters and the PLL are synchronized to be sure that the PLL has acquired a lock before the error detection is enabled.

16 Claims, 2 Drawing Sheets

DETECTION OF ADDED OR MISSING FORWARDING DATA CLOCK SIGNALS

CROSS-REFERENCE TO RELATED APPLICATIONS

The present application claims priority from U.S. Provisional Patent Application Ser. No. 60/229,830, which was filed on Aug. 31, 2000, by the present inventor for a Symmetrical Multiprocessor Computer System and is hereby incorporated herein by reference.

BACKGROUND OF THE INVENTION

1. Field of the Invention

The present invention relates to data transmission where a source synchronous clock signal travels with parallel data signals to a receiving system, and more particularly with such systems that detect and respond to received data and clock errors.

2. Background Information

Data signals are sent to and from computing and communication systems via many techniques and by many different physical paths. Serial transmission, a bit at a time, and parallel transmission where entire bytes or words are sent and received are commonplace, as are self clocking, and other clock synchronization systems. However, designers, when sending high speed transmissions of multi-bit wide data, prefer to send along a source synchronous clock signal to latch the data into the receiver system. The rationale is that the delays experienced by the various data bits are also experienced by the clock(s) so that the relative time positions of the clock and the data remains substantially constant.

FIG. 1 represents typical systems where a data sending system 2, outputs parallel data 4 along with a clock signal 6. The data path 8 may include, but are not limited to, multiple etched runs on several printed circuit boards, edge board connectors, and IC sockets connectors with mechanical or solder contacts to cables, and electronic buffers or repeaters. As with any interface that may include such multiple interconnections, poor electrical contacts, e.g. improperly seated connectors, cold solder joints, connector contaminants, and such other conditions, along the physical data paths, may result in lost and/or indeterminate data bits and, what is probably worse, indeterminate clock signals. It is assumed that Signal integrity issues are a non-issue at the time the system is shipped to the customer.

Still referencing FIG. 1, the data 4, which typically will be byte or word wide, and the clock 6 are received by a buffer 12 via edge board contacts 10. The received data and clock are fed to a latch 14 having registers 16. FIG. 2A shows one type of signal timing chart of the data and clock sent by the sending system 2. In the particular timing chart of FIG. 2A, the rising clock signal edge 20 gates data D0, Dn onto the outputs of data sending system 2, the signals travel to the data latch 14 where the falling clock signal edge 22 latches the data. Other timing arrangements are well known involving clocks and data. For example, both the rising and the falling edges of the clock can be used to latch data. As shown in FIG. 2B, the rising edge of the clock 26 latches data as shown with D0, and the falling edge latches data as shown with Dn. See item 18 of FIG. 1 and FIG. 2B.

An indeterminate clock may exhibit at the receiver system one or more extra clock edges or no edge at all. As discussed above, since the clock edge latches the data bits into the receiver latch, the clock edges are usually of most concern. Poor or intermittent connections may cause multiple clock transitions or "edges"—so unwanted clock "signals" occur. If an intermittent mechanical connection exhibits a higher impedance a clock signal may not reach an amplitude sufficient to latch data—so a full clock signal is lost. In such circumstances such clock "errors" are insidious and destructive. FIG. 3 illustrates these issues. A clock signal 30 is shown against an amplitude 32 that represents the amplitude needed to trigger a latch. The leading edge of the clock signal has a characteristic 34 that rises above, below and then again above the threshold 32. If this is the edge that latches data, there may be two latching clock signals where there should only be one. Similarly at the wailing edge of the clock signal 30 there is ringing 36. If this edge latches data there may be two (or more) latching clock signals where there should only be one. Moreover, if there is an impedance or other such anomaly where the amplitude of the clock is reduced 38, the clock signal may not reach the threshold 32 and no clock edge will latch data where there should be one.

It is well known to send along parity or error detection and correction codes, e.g. ECC, that will preserve data bit validity. In one example, parity is a single bit that together with the data bits or a byte or word make the total of the "ones" either an odd or an even number. With simple parity there is no possibility of detecting cases where more than 1 data bit is in error. Additionally, there is no possibility of correcting data bit(s) in error. Well known error correction codes, on the other hand, use additional parity bits that more surely detect errors, and provide the means to correct the majority of the typical errors.

Both parity and ECC have advantages in that they are low cost, and they preserve high bandwidth or speed of data transmissions. However, the loss of a clock signal or the existence of additional clock signals, will in most cases not be detected by parity or ECC's. For example, in most circumstances, a) an additional unwanted clock edge will simply latch in another byte or word where the bits are intact so the parity or the ECC will indicate no error; and b) a lost clock will not latch in anything so there will be no parity or ECC to indicate an error.

There are message integrity techniques that will detect both data bit errors and missing or additional clock signals. These techniques perform error detection over an entire message or packet length. Probably the best known is referred to as cyclical redundancy checks, or CRC's. CRC's were the error checking code of choice for data stored on magnetic tapes, and have been adapted to transmitted messages. A formula is predetermined for generating a CRC and the formula is resident at the sender and the receiver. A CRC byte or word is calculated by the sender for the message being sent and attached (depending upon the various formats) to the end of the message. The receiver calculates the CRC on the received message, and responds, for example, to the sender with an acknowledge if the message was received error free or with a not-acknowledge if there was an error. Quite some time ago, ASCII ACK's and NAK's were developed just for such tasks.

Since a CRC, depending upon the formula, can reliably detect errors over the entire message, a lost byte or an added byte due to clock problems will be effectively detected as will added or lost data bit type errors. However, CRC's are typically calculated on the buffered message, and since the message is not ready for processing until after the error checking is completed, message bandwidth is lost and message latency is greatly increased. Also, additional storage buffers may be needed to buffer the entire received message and the following message(s) while the CRC is being calculated on the first. Moreover, the CRC calculation may require a processor or fast, high gate count hardware logic. These disadvantages all work together to reduce the attractiveness of the clock forwarding high speed, low latency communications.

The present invention is directed to providing a fast, low cost and low gate count system and method for detecting added or lost clock signals or edges.

SUMMARY OF THE INVENTION

The above disadvantages of the known prior art are addressed by a system where additional or lost clock signals or edges are detected and where the error is generated and presented to the message receiver in near real time without the need to buffer entire messages.

A message including a series of bit parallel bytes or words are sent from a sender to a receiver along with a clock signal. The receiver latches the data with the received clock, counts the received clock and inputs the received clock to a phase locked loop (PLL) system. The PLL is arranged and constructed to generate a system clock having a frequency equal to the average frequency of the received clock. The PLL locks onto the received clock by comparing the system clock to the received clock and minimizing any phase difference between them. Once locked, the system clock has a frequency that is an average of the received clock frequency. However, the PLL system clock will not respond to transitory indeterminate clock signals.

In an embodiment, the system clock and the received clock are counted and the counts compared. Any disparity is an indication of a faulty clock signal and therefore faulty data. If the system clock counter is greater that the received clock counter a received clock edge was missed, and if the system clock counter is less than the received clock counter an additional clock edge occurred. The system design may handle such errors in many different ways as are known in the art.

An advantage of the present invention is that the error is generated in real time and is available so that the receiver can abort the receipt of the faulty data, or mark the faulty data, and inform the sender of the error, possibly even before the sender has finished sending the message.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
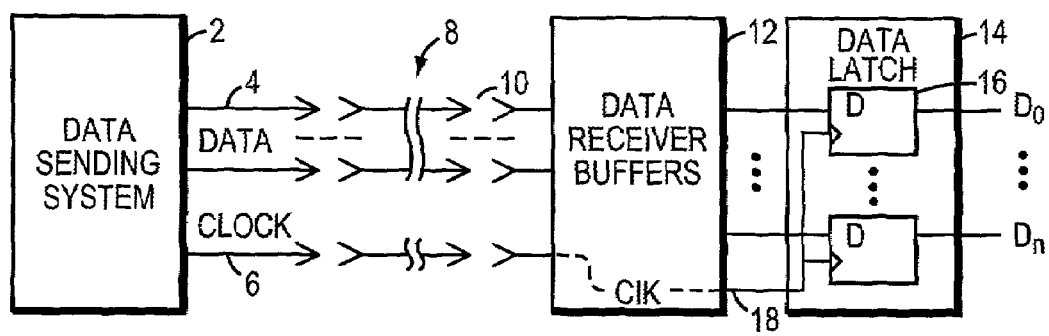
FIG. 1 is a block diagram of a typical known system.
Figure 2A:
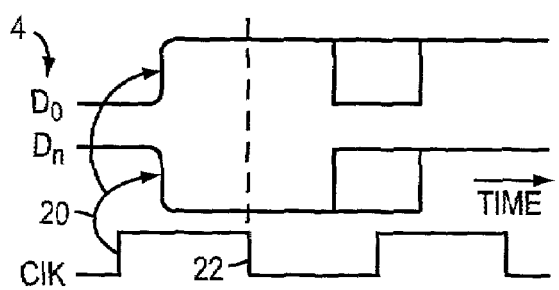
FIG. 2 is a signal time chart showing a forwarding clock signal with respect to the data signals.
Figure 2B:
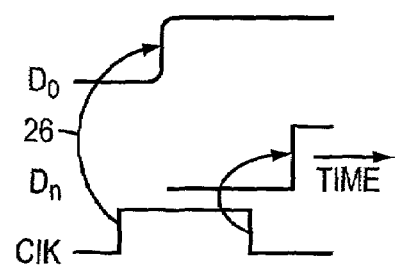
Figure 3:
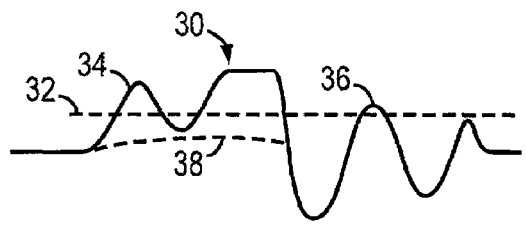
FIG. 3 is a clock time signal chart indicating anomalies.
Figure 4:
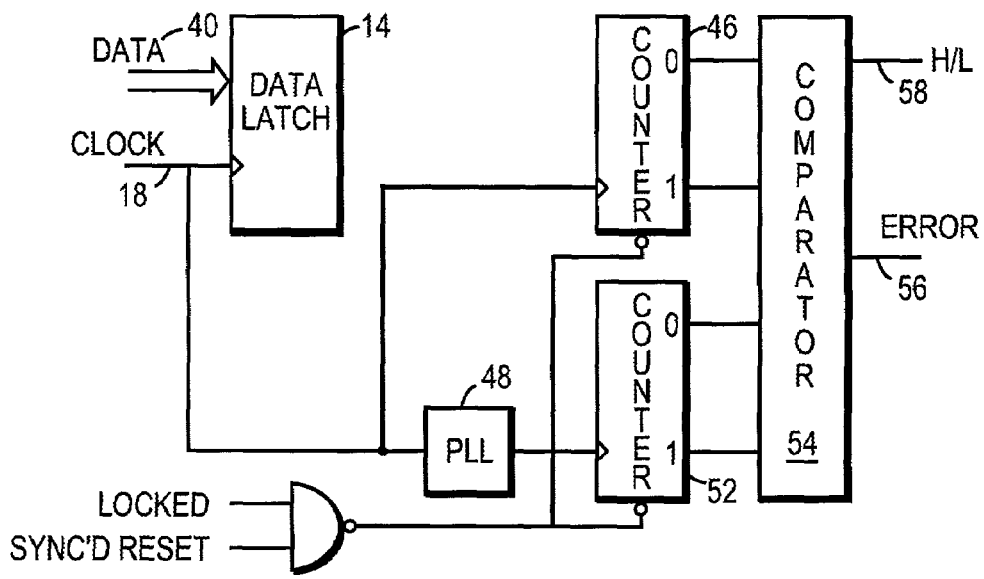
FIG. 4 is a circuit block diagram of an embodiment of the invention.

FIG. 4 is a circuit block diagram of a receiver system that receives a bit parallel data byte or word 40 that may be of any bit width. The parallel data is input to a latch 14 and loaded into the latch by a clock 18 that was sent along with the data bits.

The received clock 18 is also sent to a counter 46 and to a PLL 48. In this embodiment the counter 46 is a two bit counter, but any length counter can be used to advantage.

The PLL is arranged and constructed to output a system clock 50 (50 not on drawing 4) that is a duplicate with a frequency that is an average of the received clock 18. The system clock is also fed to a two bit counter 52. A comparator 54 receives and compares the outputs of each counter 46 and 52 and output an error 56 when the two counters do not match. An output from the comparator may be available that indicates which counter contains a higher count 58.

The receiving system may handle the errors and the type of error, along with parity and/or ECC codes, as may be determined by the system designer. Such error handling is well known in the art.

A phase locked loop, PLL, circuit is a feed back circuit that compares and corrects for phase differences between and input signal and a generated feedback signal. The PLL generates a frequency that is compared with the average of an input frequency and "locks into" that frequency by driving the phase error to zero (although there may be a set phase difference between the input and the generated frequencies). The PLL is well known in the art and has the distinction of being applicable for many different purposes. But typical applications can be broadly classed as a) frequency re-creation and multiplication, and narrow-band filtering—based on the ability to respond to an input frequency; and b) frequency modulation/demodulation—based on the ability of the phase detector and the internal voltage controlled oscillator (VCO) found in PLL's to respond to a DC voltage. In the present invention, the PLL is designed for the first (a) above listed use.

In the present invention, as in FIG. 4, the PLL 48 generates a clean system clock 50 signal that is locked in to the average frequency of the received clock signal. The PLL includes a filter (not shown) that is designed with a time response that prevents the system clock from responding to rapid fluctuations of the received clock phase. This time response is designed to zero the average phase error. In this application the average frequency of the received clock is known and there will be a "lock" time. That is, once enabled the PLL will need a number of received clock cycles before the PLL generated system clock is locked to the received clock. In this preferred embodiment, the system clock output of the PLL is arranged to provide logic level signals consistent with the hardware logic of the receiver system. Generally the logic levels are from zero to 1.8 volts.

In the present design the PLL will accept received clock signal and will lock onto its frequency, and the PLL will not immediately respond to transient added noise signals on the received clock signal, even if the noise signal crosses logic thresholds. Also, the PLL will supply a system clock cycle if a cycle of the receive clock signal is missing due to an amplitude anomaly.

It is well known in the art to design PLL's with time constants for specific acquire or lock times for the range of clock frequencies expected. Clock frequencies that range over an octave can be accommodated and acquired in one PLL design, and other ranges from the kilocycle to hundreds of megacycles can be accommodated in separate designs. Such specific designs are known in the field.

Still referring to FIG. 4, when a message composed of many data bytes or words 40 is being received, there will be a series of received clock signals 18. The PLL 48 will acquire the frequency and output a system clock 50 that matches the average frequency of the received clock. The two counters 46 and 52 must be enabled only after the PLL has acquired a lock onto the received clock frequency. The counters must be reset in synchronization with the received and the system clock to ensure proper counting.

The counters here are two bit counters but are arranged to "roll over" and continue counting. That is the following sequence will be observed, 00, 01, 10, 11, 00, 01 and so on. The comparator 54 accepts the outputs from each counter and if the counts are different, the comparator outputs a logic error signal and/or an indication of which counter is higher. The receiving system can be notified of the error by a trap or an interrupt. As mentioned before, the error handling can use any of the known processes that are practical for the systems involved.

What is claimed is:

1. An error detection system for a clock signal comprising:
   a first counter that receives and counts the clock signal,
   a phase-locked loop circuit that receives the clock signal and outputs a second clock signal,
   a second counter that receives and counts the second clock signal,
   a comparator that receives and compares the outputs of the first and the second counters, and
   an error output from the comparator that is true when the counts of the first and second counters are unequal.

2. The error detection system as defined in claim 1 further comprising a second output from the comparator that indicates which counter contains a higher count.

3. The error detection system as defined in claim 1 further comprising means for resetting the counters synchronized to the successful capture of the clock signal by the PLL.

4. The error detection system as defined in claim 1 further comprising:
   a sender that sends data and the clock signal, the clock signal defined as a forwarding source synchronous clock signal, and
   a receiver latch that accepts and latches the data therein with the forwarding clock.

5. A method for detecting clock signal errors comprising the steps of:
   a first counting of the first clock signals,
   providing a second clock signal with a frequency that is locked to the average frequency of the first clock signal,
   a second counting of the second clock signals,
   detecting a difference between the first and the second countings, and
   signaling an error therewith.

6. The method as defined in claim 5 further comprising the step of: signaling which counting is higher.

7. The method as defined in claim 5 further comprising the step of synchronizing the two countings.

8. The method as defined in claim 5 further comprising the steps of:
   sending data and the clock signal, wherein the clock signal is a forwarding source synchronous clock signal,
   receiving the data, and
   latching the data with the forwarding clock signal.

9. A system for detecting errors in a first clock signal, the system comprising:
   means for counting the first clock signal,
   means, responsive to the first clock signal, for generating a second clock signal,
   means for counting the second clock signal,
   means for comparing the count of the first clock signal with the count of the second clock signal, and
   means for generating an error when the count of the first clock signal differs from the count of the second clock signal.

10. The system of claim 9 wherein
    the first clock signal has an average frequency, and
    the second clock signal is locked to the average frequency of the first clock signal.

11. The system of claim 9 wherein
    the first clock signal has a plurality of rising edges and a plurality of falling edges, and
    the means for counting the first clock signal counts one of the rising and falling edges.

12. The system of claim 9 wherein
    the first clock signal has a plurality of rising edges and a plurality of falling edges, and
    the means for counting the first clock signal counts both the rising and falling edges.

13. The system of claim 10 wherein the means for generating a second clock signal includes a phase lock loop (PLL) circuit.

14. The system of claim 9 further comprising means for determining whether the count of the first clock signal is higher or lower than the count of the second clock signal.

15. The system of claim 14 wherein the means for generating a second clock signal includes a phase lock loop (PLL) circuit.

16. The system of claim 14 wherein
    the first clock signal has an average frequency, and
    the second clock signal is locked to the average frequency of the first clock signal.

* * * * *

UNITED STATES PATENT AND TRADEMARK OFFICE
CERTIFICATE OF CORRECTION

PATENT NO. : 7,065,169 B2  Page 1 of 1
APPLICATION NO. : 09/944500
DATED : June 20, 2006
INVENTOR(S) : David W. Hartwell It is certified that error appears in the above-identified patent and that said Letters Patent is hereby corrected as shown below:

In column 2, line 13, delete "wailing" and insert -- trailing --, therefor.

Signed and Sealed this

Twenty-eighth Day of July, 2009

JOHN DOLL
*Acting Director of the United States Patent and Trademark Office*